(12) United States Patent
Kihara et al.

(10) Patent No.: US 7,858,199 B2
(45) Date of Patent: *Dec. 28, 2010

(54) METAL-CLAD LAMINATE

(75) Inventors: Shuta Kihara, Kanagawa (JP); Ko Kedo, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/839,282

(22) Filed: May 6, 2004

(65) Prior Publication Data

US 2004/0265609 A1 Dec. 30, 2004

(30) Foreign Application Priority Data

| May 6, 2003 | (JP) | ............................. 2003-128099 |
| May 8, 2003 | (JP) | ............................. 2003-130256 |
| May 13, 2003 | (JP) | ............................. 2003-134473 |

(51) Int. Cl.
*B32B 15/08* (2006.01)
*B32B 27/08* (2006.01)

(52) U.S. Cl. ................ 428/458; 428/473.5; 428/901

(58) Field of Classification Search ................ 428/458, 428/901

See application file for complete search history.

(56) References Cited

U.S. PATENT DOCUMENTS

| 4,053,370 A | * | 10/1977 | Yamashita et al. ........... 156/151 |
| 4,094,862 A | * | 6/1978 | Bell ............................ 528/229 |
| 4,152,195 A | * | 5/1979 | Bahrle et al. .................. 216/18 |
| 4,470,944 A | * | 9/1984 | Asakura et al. ............. 264/216 |
| 4,915,983 A | * | 4/1990 | Lake et al. .................. 430/314 |
| 5,026,823 A | * | 6/1991 | Summers et al. ............. 528/353 |
| 6,214,923 B1 | * | 4/2001 | Goto et al. ................... 524/514 |
| 7,217,462 B2 | * | 5/2007 | Kihara et al. ................ 428/458 |
| 7,285,321 B2 | * | 10/2007 | Kanakarajan et al. ....... 428/209 |
| 2003/0012882 A1 | | 1/2003 | Tokuhisa et al. |
| 2004/0197699 A1 | * | 10/2004 | Nakayama et al. ........ 430/270.1 |
| 2005/0238986 A1 | * | 10/2005 | Itoh ......................... 430/110.2 |

FOREIGN PATENT DOCUMENTS

| CN | 1406262 | | 3/2003 |
| EP | 0356928 | * | 8/1989 |
| JP | 2002-322274 A | * | 11/2002 |

OTHER PUBLICATIONS

Chinese Official Action for Application No. 200410090309.0, dated Aug. 10, 2007.

* cited by examiner

*Primary Examiner*—Kevin R. Kruer
(74) *Attorney, Agent, or Firm*—Antonelli, Terry, Stout & Kraus, LLP.

(57) ABSTRACT

The flexible metal-clad laminate of the present invention comprises at least one polyimide layer made of a polyimide having repeating units represented by the following formula I:

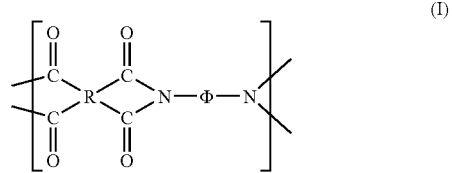

wherein R and Φ are as defined in the specification, and at least one metal layer. The polyimide is soluble in solvents and excellent in heat resistance and adhesion property, and shows a low dielectric constant even in a high frequency range.

41 Claims, No Drawings

METAL-CLAD LAMINATE

BACKGROUND OF THE INVENTION

1. Field of the Invention

The present invention relates to a flexible metal-clad laminate and a flexible, rigid metal-clad laminate using a low-dielectric constant polyimide having a good heat resistance and a good adhesion property. The metal-clad laminate is applicable to printed wiring boards, surface heating elements, electromagnetic shielding materials, flat cables, etc.

2. Description of the Prior Art

Metal-clad laminates have been mainly used as a substrate for printed wiring boards. With the recent rapid progress of miniaturization and high integration of electronic devices using printed wiring boards, there is an increasing demand for high-speed operation of these devices. To meet the demand, flexible metal-clad laminates, the electric insulating layer thereof being capable of being readily reduced in its thickness, have been increasingly used. In particular, in the application fields such as information processing and telecommunications, transmission frequency or operating frequency of CPU becomes higher in order to transmit or process a large content of information data. Therefore, it is required to shorten the time delay of signal transmission rate by reducing the dielectric constant of insulating layer in addition to making the insulating layer thinner.

Aromatic polyimides having excellent heat resistance and mechanical properties have been extensively used as the electric insulating material for the flexible metal-clad laminates. For example, Japanese Patent Application Laid-Open No. 55-91895 proposes a three-layered metal foil-clad laminate comprising an aromatic polyimide film and a metal foil which are bonded to each other through an adhesive film. Japanese Patent Application Laid-Open No. 56-139953 discloses a two-layered metal foil-clad laminate comprising a heat-fusible aromatic polyimide film and a metal foil which are directly press-bonded to each other under heating. However, since epoxy-based or acryl-based adhesives are mainly used as the adhesive in the conventional three-layered flexible metal-clad laminates, the laminates obtained after bonding through such adhesives are insufficient in heat resistance, resulting in limitations to the conditions for subsequent processing and use. The conventional two-layered flexible metal foil-clad laminates exhibit a good heat resistance because the insulating layer is entirely made of polyimide. However, since the polyimide used as the insulating layer is aromatic, the dielectric constant at 10 GHz of the insulating layer unfavorably becomes as high as about 3.5, although varies depending upon the content of aromatic ring.

Japanese Patent Application Laid-Open No. 8-250860 discloses a metal foil-clad laminate obtained by applying an aromatic polyamic acid solution onto a metal foil and then heat-treating the applied solution to imidate the aromatic polyamic acid. However, the aromatic polyimides used in the insulating layers of the conventional flexible metal foil-clad laminates have a dielectric constant as high as about 3.5 at 10 GHz, although it varies depending upon the content of aromatic ring. Further, the aromatic polyimides cannot be made into solutions because of its insolubility to various solvents. Therefore, as described above, the treatment for imidation is required after applying the solution of polyamic acid as a precursor of polyimide in the production of the metal foil-clad laminates, increasing the production facility costs and production costs.

It has been also required to make the wirings of printed wiring boards finer. Therefore, there is a demand for further reducing the thickness of metal foil in some applications. Under this circumstance, there have been developed methods for producing a flexible laminate clad with a metal thin film having a thickness of 10 μm or less which is formed on a surface of an electric insulating film by sputtering, vapor deposition, electroless plating, electroplating or the like (Japanese Patent Application Laid-Open Nos. 9-51163, 8-34866 and 5-90737). Aromatic polyimide films have been extensively used as the electric insulating material for such flexible metal foil-clad laminates. However, as described above, the aromatic polyimides unfavorably have a slightly high dielectric constant, i.e., about 3.5 at 10 GHz although it varies depending upon the content of aromatic ring.

It has been known that the dielectric constant of a polymeric material can be generally reduced by using an aliphatic monomer. The inventors have produced various polyimides from non-aromatic tetracarboxylic dianhydrides. Examples of the non-aromatic tetracarboxylic dianhydride include aliphatic (chain) tetracarboxylic dianhydrides such as 1,2,3,4-butanetetracarboxylic dianhydride, and alicyclic tetracarboxylic anhydrides such as 1,2,3,4-cyclobutanetetracarboxylic dianhydride, 1,2,4,5-cyclopentanetetracarboxylic dianhydride and bicyclo[2.2.2]octa-7-ene-2,3,5,6-tetracarboxylic dianhydride. However, polyimides obtained from the aliphatic (chain) tetracarboxylic dianhydride have an extremely low heat resistance and are inapplicable to the processing such as welding, reducing its practical utility. On the other hand, polyimides obtained from the alicyclic tetracarboxylic anhydride have an improved heat resistance as compared to those obtained from the chain tetracarboxylic dianhydride. However, since polyimides obtained from 1,2,3,4-cyclobutanetetracarboxylic dianhydride have a low solubility to solvents, the application of a solution of such polyimides onto a metal foil or a film forming substrate fails to form a polyimide film having a sufficient thickness. Although 1,2,4,5-cyclopentanetetracarboxylic dianhydride and bicyclo[2.2.2]octa-7-ene-2,3,5,6-tetracarboxylic dianhydride provide polyimides having a high solubility to solvents, the laminate obtained by applying the polyimide solution onto a metal foil or a film-forming substrate fails to have a flexibility, reducing the practical utility.

SUMMARY OF THE INVENTION

An object of the present invention is to solve problems encountered in the conventional insulating layers made of aromatic polyimides, and provide a flexible metal-clad laminate using a low dielectric polyimide that is solvent-soluble and excellent in heat resistance and adhesion property.

As a result of extensive studies in view of solving the above problems, the inventors have found that polyimides having repeating units with a specific alicyclic tetracarboxylic acid structure are soluble in solvents and exhibit good heat resistance and adhesion property as well as a low dielectric constant, and a flexible metal-clad laminate produced using such polyimides exhibits extremely excellent properties. The present invention has been accomplished on the basis of this finding.

Thus, the present invention provides a flexible metal-clad laminate comprising:

at least one polyimide layer made of a polyimide having repeating units represented by the following formula I:

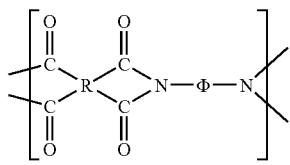
(I)

wherein R is a tetravalent group derived from cyclohexane; Φ is a $C_2$ to $C_{39}$ divalent aliphatic, alicyclic or aromatic group, or a combination of these divalent groups, with the proviso that at least one group selected from the group consisting of —O—, —SO$_2$—, —CO—, —CH$_2$—, —C(CH$_3$)$_2$—, —OSi(CH$_3$)$_2$—, —C$_2$H$_4$O— and —S— optionally intervenes in a main chain of Φ; and at least one metal layer.

The laminated structure of the metal layer and the polyimide layer is produced by a method of applying a solution of the above polyimide (hereinafter occasionally referred to as "polyimide A") in an organic solvent onto a metal foil and then drying the solution applied; a method of thermopress-bonding a film made of the polyimide A to a metal foil; or a method of depositing at least one metal film on a film made of the polyimide A by at least one thin film-forming method selected from the group consisting of sputtering, vapor deposition and electroless plating. The metal layer may be formed on one or both surfaces of the polyimide layer.

In one preferred embodiment of the present invention, the flexible metal-clad laminate may be further laminated with another flexible metal-clad laminate or with a rigid printed wiring board of any types.

In another embodiment of the present invention, circuit patterns may be formed in the surface metal layer; a flexible metal-clad laminate having the circuit patterns formed therein may be laminated with another flexible metal-clad laminate; or a plurality of the flexible metal-clad laminate having the circuit patterns formed therein may be laminated with each other.

In a still another embodiment of the present invention, a cover layer made of the polyimide A may be formed on the surface on which circuit patterns are formed. The cover layer may be patterned by a wet etching method using an aprotic organic polar solvent as an etchant.

The polyimide A preferably has a glass transition temperature of 350° C. or lower, and a dielectric constant of 3.2 or less at 10 GHz.

DETAILED DESCRIPTION OF THE INVENTION

The polyimide used in the present invention has repeating units represented by the formula I:

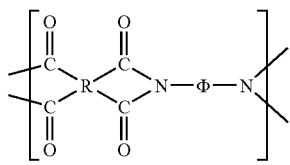
(I)

In the formula I, R is a tetravalent group derived from cyclohexane. Φ is a $C_2$ to $C_{39}$ divalent aliphatic, alicyclic or aromatic group, or a combination of these divalent groups. At least one group selected from the group consisting of —O—, —SO$_2$—, —CO—, —CH$_2$—, —C(CH$_3$)$_2$—, —OSi(CH$_3$)$_2$—, —C$_2$H$_4$O— and —S— optionally intervenes in a main chain of Φ.

Examples of the preferred Φ include aliphatic groups such as polyalkylene, polyoxyalkylene, xylylene and alkyl- or halogen-substituted groups thereof; divalent alicyclic groups derived from cyclohexane, dicyclohexylmethane, dimethyl-cyclohexane, isophorone, norbornane and alkyl- or halogen-substituted compounds thereof; and divalent aromatic groups derived from benzene, naphthalene, biphenyl, diphenyl-methane, diphenyl ether, diphenyl sulfone, benzophenone and alkyl- or halogen-substituted compounds thereof. Specific examples of Φ include divalent groups represented by the following formulae:

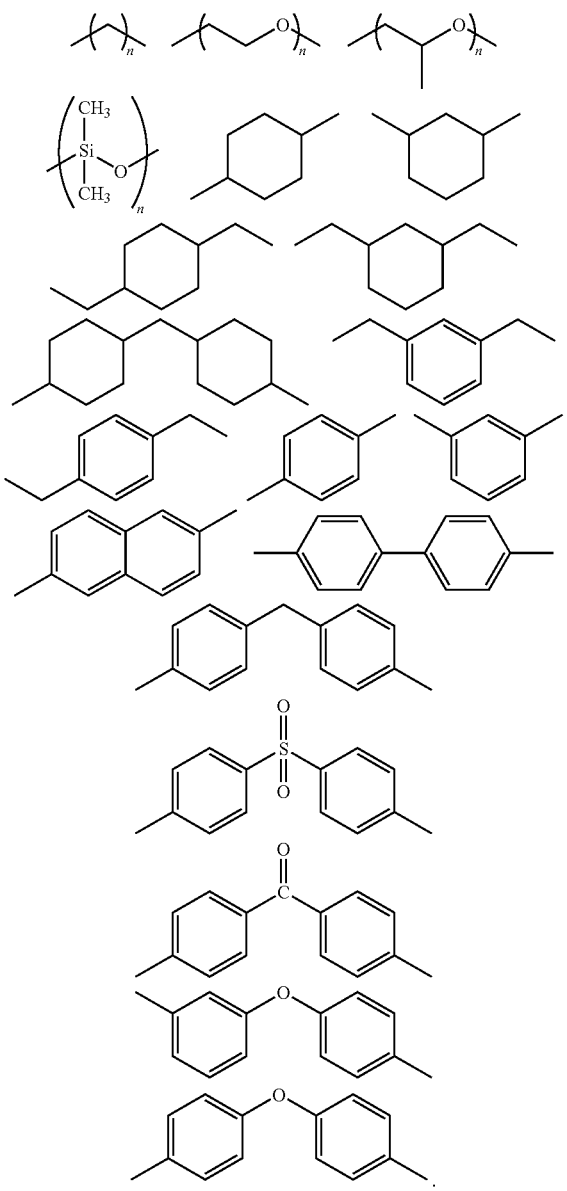

The content of the repeating unit represented by the formula I is preferably 10 to 100 mol % and more preferably 50 to 100 mol % of the total repeating units. The number of the repeating units represented by the formula I in one molecule of the polyimide is preferably 10 to 2000 and more preferably 20 to 200.

The polyimide A is produced by the reaction of a tetracarboxylic acid component with a diamine-related component (diamine and its derivatives). Examples of the tetracarboxylic acid components include cyclohexanetetracarboxylic acid, cyclohexanetetracarboxylic acid esters and cyclohexanetetracarboxylic dianhydrides, with cyclohexanetetracarboxylic dianhydrides being preferred. It should be noted that the tetracarboxylic acid components include various position isomers.

The polyimide A having a cyclohexanetetracarboxylic acid skeleton derived from the tetracarboxylic acid component is advantageous in view of obtaining a flexible film because its molecular weight is easily increased, and forming and processing the film because its solubility to solvents is sufficiently high.

The tetracarboxylic acid component may contain at least one compound selected from the group consisting of other tetracarboxylic acids and derivatives thereof unless the addition thereof adversely affects the solubility of the polyimide A to solvents, flexibility of resultant films, thermopress-bonding property and high-frequency properties. Examples of other tetracarboxylic acids and derivatives thereof include pyromellitic acid, 3,3',4,4'-biphenyltetracarboxylic acid, 2,3,3',4' biphenyltetracarboxylic acid, 2,2-bis(3,4-dicarboxyphenyl)propane, 2,2-bis(2,3-dicarboxyphenyl)propane, 2,2-bis(3,4-dicarboxyphenyl)-1,1,1,3,3,3-hexafluoropropane, 2,2-bis(2,3-dicarboxyphenyl)-1,1,1,3,3,3-hexafluoropropane, bis(3,4-dicarboxyphenyl) sulfone, bis(3,4-dicarboxyphenyl) ether, bis(2,3-dicarboxyphenyl) ether, 3,3',4,4'-benzophenonetetracarboxylic acid, 2,2',3,3'-benzophenonetetracarboxylic acid, 4,4-(p-phenylenedioxy)diphthalic acid, 4,4-(m-phenylenedioxy)diphthalic acid, ethylenetetracarboxylic acid, 1,2,3,4-butanetetracarboxylic acid, 1,2,3,4-cyclobutanetetracarboxylic acid, 1,2,4,5-cyclopentanetetracarboxylic acid, 3-carboxymethyl-1,2,4-cyclopentanetricarboxylic acid, bicyclo[2.2.2]octa-7-ene-2,3,5,6-tetracarboxylic acid, dicyclohexyltetracarboxylic acid, 1,1-bis(2,3-dicarboxyphenyl)ethane, bis(2,3-dicarboxyphenyl)methane, bis(3,4-dicarboxyphenyl)methane and derivatives thereof.

Examples of the diamine-related component include diamines, diisocyanates and diaminodisilanes, with diamines being preferred. The content of the diamines in the diamine-related component is preferably 50 mol % or higher (inclusive of 100 mol %).

The diamine may be aliphatic diamines, aromatic diamines or mixtures thereof. In the present invention, the "aromatic diamine" means a diamine having amino groups directly bonded to aromatic ring, which may contain an aliphatic group, alicyclic group or another substituent in its structure. The "aliphatic diamine" means a diamine having amino groups directly bonded to an aliphatic or alicyclic group, which may contain an aromatic group or another substituent in its structure.

In general, when the aliphatic diamine is used as a component, it is rather difficult to obtain a high molecular polyimide, because the intermediate polyamic acid and the aliphatic diamine form a strongly bonded complex. Therefore, it is necessary to take suitable measures such as the use of a solvent having a relatively high dissolving power to the complex, for example, cresol. On the other hand, when the cyclohexanetetracarboxylic acid or its derivative is used together with the aliphatic diamine as constituting components, the molecular weight of the polyimide is easily increased, because the intermediate polyamic acid and the aliphatic diamine form a relatively weakly bonded complex.

Examples of the aliphatic diamines include 4,4'-diaminodicyclohexylmethane, ethylenediamine, hexamethylenediamine, polyethylene glycol bis(3-amonopropyl) ether, polypropylene glycol bis(3-aminopropyl) ether, 1,3-bis(aminomethyl)cyclohexane, 1,4-bis(aminomethyl)cyclohexane, m-xylylenediamine, p-xylylenediamine, isophoronediamine, norbornanediamine, and siloxanediamine.

Examples of the aromatic diamines include 4,4'-diaminodiphenyl ether, 4,4'-diaminodiphenylmethane, 4,4'-diaminodiphenyl sulfone, m-phenylenediamine, p-phenylenediamine, diaminobenzophenone, 2,6-diaminonaphthalene and 1,5-diaminonaphthalene.

In the present invention, the polyimide A is usually produced in the form of a solution in organic solvent. Examples of the organic solvents include N-methyl-2-pyrrolidone, N,N-dimethylacetoamide, N,N-dimethylformamide, dimethylsulfoxide, hexamethylphosphoraimde, tetramethylenesulfone, p-chlorophenol, m-cresol and 2-chloro-4-hydroxytoluene.

The solution of the polyimide A in organic solvent is produced by the following methods (i) to (iii):

(i) After adding the tetracarboxylic acid component to an organic solvent solution of the diamine-related component or adding the diamine-related component to an organic solvent solution of the tetracarboxylic acid component, the resultant mixture is maintained preferably at 80° C. or lower and more preferably at about room temperature or lower for 0.5 to 3 h. After added with an azeotropic dehydrating solvent such as toluene and xylene, the resultant solution of the intermediate polyamic acid is subjected to dehydration while azeotropically removing the generated water out of the reaction system to obtain a solution of the polyimide A in organic solvent.

(ii) After imidating the intermediate polyamic acid by adding a dehydrating agent such as acetic anhydride into a solution of the polyamic acid, the polyimide A is precipitated by adding a poor solvent for the polyimide A such as methanol. The solid polyimide A separated by filtering, washing and drying is dissolved in a solvent such as N,N-dimethylacetamide to obtain a solution of the polyimide A in organic solvent.

(iii) A solution of the polyamic acid prepared by using a high-boiling solvent such as cresol is maintained at 150 to 220° C. for 3 to 12 h to allow the imidation to proceed. Then, the polyimide A is precipitated by adding a poor solvent for the polyimide A such as methanol. The solid polyimide A separated by filtering, washing and drying is dissolved in a solvent such as N,N-dimethylacetamide to obtain a solution of the polyimide A in organic solvent.

The concentration of the polyimide A in the organic solvent solution is preferably 5 to 50% by weight and more preferably 10 to 40% by weight.

In the present invention, the polyimide layer is formed by applying the organic solvent solution of the polyimide A which is produced by any of the above methods (i) to (iii) on a metal foil, etc., and then evaporating the solvent by heating. Alternatively, a polyimide film previously produced from the organic solvent solution can be used as the polyimide layer. In that case the polyimide film may be produced by applying the organic solvent solution of the polyimide A on a substrate such as a glass plate and a metal plate, evaporating the solvent by heating at 200 to 350° C., and then separating the film from the substrate. Alternatively, the polyimide film may be produced by applying the organic solvent solution of polyamic acid on a substrate such as a glass plate and a metal plate, and then allowing the dehydrating imidation to proceed by heating at 200 to 350° C. The polyimide layer preferably has a thickness of 10 to 100 μm.

The polyimide A used in the present invention is extremely suitable as an insulating material, because the dielectric constant is low at high frequencies, and, in addition thereto, the frequency dependency of dielectric constant is small in the practically important frequency range of 1 to 20 GHz and the dielectric constant is substantially unchanged in the frequency range. The use of the aliphatic diamine is particularly preferred because a dielectric constant of 2.8 or lower at 10 GHz is achieved. However, even using the aromatic diamine, a dielectric constant of 3.2 or lower is achieved. The lowest dielectric constant to be achieved is usually 2.6. In addition, excellent high-frequency property of the polyimide A is proved by the characteristics that a dielectric loss tangent has a small frequency dependency and is substantially constant within the range of 0.008 to 0.018 in a frequency range of 1 to 20 GHz.

The polyimide film made of the polyimide A has a glass transition temperature of about 350° C. or lower although it varies depending upon the type of diamine used. The polyimide film exhibits its adhesion property at its glass transition temperature or higher although it varies depending upon the residual amount of solvent. If the glass transition temperature is too high, an excessively high thermopress-bonding temperature is correspondingly required. If the glass transition temperature is too low, the heat resistance of the film itself becomes insufficient. The glass transition temperature is preferably 200 to 350° C. and more preferably 250 to 320° C.

Examples of the material of the metal foil for forming the metal layer include copper, aluminum, stainless steel, gold, silver and nickel, with copper, aluminum and stainless steel being preferred. The thickness of the metal foil is not particularly limited and usually 5 to 100 μm in view of good processability.

The flexible metal-clad laminate of a polyimide layer/metal layer laminate structure is produced by applying the organic solvent solution of the polyimide A onto a metal foil and then evaporating the solvent by heating at 100 to 350° C. to form a thin film of the polyimide A on the metal foil.

By thermopress-bonding a previously prepared polyimide film and a metal foil or by thermopress-bonding two metal foils and a polyimide film interposed therebetween, a flexible metal-clad laminate of a polyimide layer/metal layer laminate structure or a metal layer/polyimide layer/metal layer laminate structure is produced.

A flexible metal-clad laminate of a metal layer (one or more layers)/polyimide layer laminate structure or a metal layer (one or more layers)/polyimide layer/metal layer (one or more layers) is produced by forming at least one metal thin film on one or both surfaces of the polyimide film by at least one thin film-forming method selected from the group consisting of sputtering, vapor deposition and electroless plating. The vapor deposition include, in addition to ordinary vapor deposition methods, CVD and ion-plating. After forming the thin metal film by the above methods, additional metal film may be further formed on the previously formed metal film by another method such as electroplating (electrolytic plating) to obtain a desired thickness.

The metals for use in the thin film-forming methods are copper, nickel, chromium, tin, cobalt and gold, with copper and nickel being preferred. The thickness of the thin metal film is not particularly limited, and, in view of making full use of the thin film-forming method, preferably 10 μm or less and more preferably 2 to 10 μm because such a range of thickness cannot be attained by other methods.

Prior to forming the thin metal film, the surface of the polyimide film may be subjected to known pretreatments such as alkaline chemical treatment, plasma treatment and sandblast treatment in order to further enhance the adhesion strength between the polyimide film and the thin metal film.

A double-sided flexible metal-clad laminate (flexible metal-clad laminate having metal layers on both surfaces) is produced by integrally thermopress-bonding a metal foil to the polyimide layer (polyimide layer formed by applying the organic solvent solution, or polyimide film) of the flexible metal-clad laminate of a polyimide layer/metal layer laminate structure which is produced by each of the methods described above. In addition, the double-sided flexible metal-clad laminate is produced by integrally thermopress-bonding two flexible metal-clad laminates of a polyimide layer/metal layer laminate structure, which is produced by the methods described above, with the polyimide layers being opposed to each other.

A flexible, rigid metal-clad laminate is produced by integrally thermopress-bonding a rigid printed wiring board to the metal layer or the polyimide layer of at least one of the flexible metal-clad laminate of a polyimide layer/metal layer laminate structure and the double-sided flexible metal-clad laminate, each being produced by the methods described above.

A multilayer metal-clad laminate is produced by forming circuit patterns in the surface metal layer of the flexible metal-clad laminate of a polyimide layer/metal layer laminate structure, the double-sided flexible metal-clad laminate or the flexible, rigid metal-clad laminate, each being produced by the methods described above, thereby obtaining a printed wiring board, and then integrally thermopress-bonding at least one flexible metal-clad laminate of the present invention to the printed wiring board through the metal or polyimide layer. In addition, another multilayer metal-clad laminate having more layers is produced by integrally thermopress-bonding a plurality of printed wiring boards through the metal or polyimide layer, which printed wiring boards are produced by forming circuit patterns in the surface metal layer of the flexible metal-clad laminate of a polyimide layer/metal layer laminate structure, the double-sided flexible metal-clad laminate, the flexible, rigid metal-clad laminate or the multilayer metal-clad laminate, each being produced by the methods described above.

By applying the organic solvent solution of the polyimide A as a cover coat agent and drying, a protecting film of the polyimide A may be formed on the circuit-patterned surface metal layer of the flexible metal-clad laminate of a polyimide layer/metal layer laminate structure, the double-sided flexible metal-clad laminate, the flexible, rigid metal-clad laminate or the multilayer metal-clad laminate, each being produced by the methods described above. Alternatively, instead of applying the organic solvent solution, the protective layer may be formed by thermopress-bonding at least one polyimide film as a cover lay film to the circuit-patterned surface.

The thermopress-bonding may be performed by a hot press or may be continuously performed using pressure rollers. The thermopress-bonding temperature is preferably 200 to 400° C. and more preferably 250 to 350° C. The thermopress-bonding pressure is preferably 0.1 to 200 kgf/cm$^2$ and more preferably 1 to 100 kgf/cm$^2$. The thermopress-bonding may be conducted under reduced pressure to remove the solvent or bubbles. The flexible metal-clad laminate produced under the above conditions exhibits a good adhesion strength between the metal layer and the polyimide layer, for example, the adhesion strength between the polyimide layer and an electrolytic copper foil is 1 kgf/cm or higher.

The polyimide A used in the present invention is soluble in an aprotic organic polar solvent. Therefore, the polyimide layer of the metal-clad laminates produced by the above methods or the polyimide layer of the printed wiring boards having circuit patterns may be patterned by wet-etching using the aprotic organic polar solvent as an etchant. The formation of viaholes or flying leads and the removal of a cover coat over terminals are considerably facilitated as compared to the conventional patterning methods by dry-etching, resulting in the considerable improvement in productivity.

The present invention will be described in more detail below with reference to the following examples. However, these examples are only illustrative and not intended to limit the invention thereto.

Polyimide films, single-sided flexible copper-clad laminates and double-sided flexible copper-clad laminates obtained in the examples and comparative examples were evaluated by the following methods.

(1) Dielectric Constant and Dielectric Loss Tangent

Measured by a cavity resonator perturbation method using a dielectric constant/dielectric loss tangent measuring apparatuses "CP431/461/501//531" available from Kanto Electronics Application & Development Inc.

(2) Glass Transition Temperature

Determined by DSC measurement at a temperature rise rate of 10° C./min using a differential scanning calorimeter "DSC-50" available from Shimadzu Corporation.

(3) Adhesion Strength

Measured according to JIS C 6481.

Reference Example

Production of 1,2,4,5-Cyclohexanetetracarboxylic Dianhydride

A 5-L Hastelloy (H$_{22}$) autoclave was charged with 552 g of pyromellitic acid, 200 g of a catalyst, rhodium carried on activated carbon, available from N.E. Chemcat Corporation, and 1656 g of water. The inner atmosphere of the reactor was replaced with nitrogen gas under stirring. After replacing the inner atmosphere of the reactor with hydrogen gas, the hydrogen pressure was adjusted to 5.0 MPa and the temperature was raised to 60° C. While maintaining the hydrogen pressure at 5.0 MPa, the reaction was allowed to proceed for 2 h. Then, after replacing the hydrogen gas with nitrogen gas, the reaction product solution taken out of the autoclave was filtered while it was still hot to separate the catalyst. The filtrate was concentrated by evaporating water under reduced pressure using a rotary evaporator to precipitate crystals. The precipitated crystals were separated by solid-liquid separation and dried to obtain 481 g of 1,2,4,5-cyclohexanetetracarboxylic acid (yield: 85.0%).

Successively, 450 g of the obtained 1,2,4,5-cyclohexanetetracarboxylic acid and 4000 g of acetic anhydride were charged into a 5-L glass separable flask equipped with a Dimroth condenser. The inner atmosphere of the reactor was replaced with nitrogen gas under stirring. The temperature was raised to the refluxing temperature of the solvent to allow the solvent to reflux for 10 min. Thereafter, the temperature was lowered to room temperature under stirring to precipitate crystals. The precipitated crystals were separated by solid-liquid separation and dried to obtain primary crystals. The mother liquor after separation was concentrated under reduced pressure using a rotary evaporator to precipitate crystals. The precipitated crystals were separated by solid-liquid separation and dried to obtain secondary crystals. In total of the primary and secondary crystals, 375 g of 1,2,4,5-cyclohexanetetracarboxylic dianhydride was obtained (yield of anhydration: 96.6%).

Example 1

In a 500-mL five-necked flask equipped with a thermometer, a stirrer, a nitrogen inlet, a branched dropping funnel, a Dean-Stark trap and a condenser, 10.0 g (0.05 mol) of 4,4'-diaminodiphenyl ether was dissolved in 85 g of N-methyl-2-pyrrolidone as a solvent under a nitrogen gas flow. Into the resultant solution, 11.2 g. (0.05 mol) of the solid 1,2,4,5-cyclohexanetetracarboxylic dianhydride produced in Reference Example was added in several portions over one hour at room temperature, and the stirring was continued for 2 h at room temperature. Then, 30.0 g of xylene as an azeotropic dehydrating solvent was added to the solution, and the temperature was raised to 180° C. to allow the reaction to proceed for 3 h, while azeotropically removing the generated water with xylene being allowed to reflux through the Dean-Stark trap. After three hours, it was confirmed that the water was no longer distilled. Then, the temperature was raised to 190° C. over one hour to recover 29.0 g of xylene by distillation. After lowering the inner temperature to 60° C. by air cooling, the reaction product solution was taken out of the reactor. The obtained solution was applied onto a glass plate and heated for one hour on a hot plate at 90° C. to evaporate the solvent. The resultant film was separated from the glass plate to obtain a self-supporting film. The self-supporting film was fixed to a stainless steel jig and then heated in a hot air dryer at 220° C. for 2 h to further evaporate the solvent, thereby obtaining a 100 μm-thick light-brown flexible film. By IR spectrum analysis of the obtained film, the product was identified as a polyimide having repeating units represented by the following formula II:

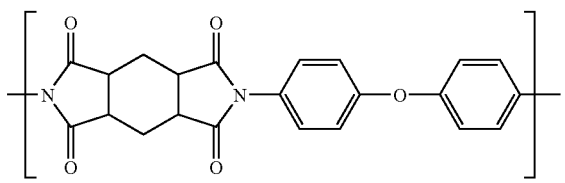

(II)

on the basis of the characteristic absorptions attributable to the imide ring at ν(C═O) 1772, 1700 cm$^{-1}$.

The glass transition temperature, dielectric constant and dielectric loss tangent of the film are shown in Tables 1 and 2.

The obtained polyimide solution was applied onto a 18 μm-thick electrolytic copper foil "3EC-VLP" available from Mitsui Mining & Smelting Co., Ltd., heated on a hot plate at 90° C. for one hour to evaporate the solvent, and, after fixed to a stainless steel jig, heated in a hot air dryer at 220° C. for 2 h to further evaporate the solvent, thereby obtaining a single-sided flexible copper-clad laminate having a 25 μm-thick polyimide layer. A separate 18 μm-thick electrolytic copper foil of the same type as used above was further thermopress-bonded to the polyimide layer of the single-sided flexible copper-clad laminate by a hot press at 330° C. for 30 min to obtain a double-sided flexible copper-clad laminate. The adhesion strength of the double-sided flexible copper-clad laminate is shown in Table 1.

Example 2

In a 500-mL five-necked flask of the same type as used in Example 1, 11.2 g (0.05 mol) of 1,2,4,5-cyclohexanetetracarboxylic dianhydride produced in Reference Example was dissolved in 40.0 g of N-methyl-2-pyrrolidone as a solvent. Into the resultant solution, a solution prepared by dissolving 10.5 g (0.05 mol) of 4,4'-diaminodicyclohexylmethane in 45.0 g of dimethylacetamide was added dropwise over 2 h through the dropping funnel. After completion of the dropwise addition, the mixture was heated to 90° C. and stirred for one hour. Then, 30.0 g of xylene as an azeotropic dehydrating solvent was added to the solution, and the temperature was raised to 180° C. to allow the reaction to proceed for 3 h, while azeotropically removing the generated water with xylene being allowed to reflux through the Dean-Stark trap. After three hours, it was confirmed that the water was no longer distilled. Then, the temperature was raised to 190° C. over one hour to recover 30.0 g of xylene by distillation. After lowering the inner temperature to 60° C. by air cooling, the reaction product solution was taken out of the reactor. The obtained solution was applied onto a glass plate and heated for one hour on a hot plate at 90° C. to evaporate the solvent. The resultant film was separated from the glass plate to obtain a self-supporting film. The self-supporting film was fixed to a stainless steel jig and then heated in a hot air dryer at 220° C. for 2 h to further evaporate the solvent, thereby obtaining a 100 μm-thick colorless transparent flexible film. By IR spectrum analysis of the obtained film, the product was identified as a polyamide having repeating units represented by the following formula III:

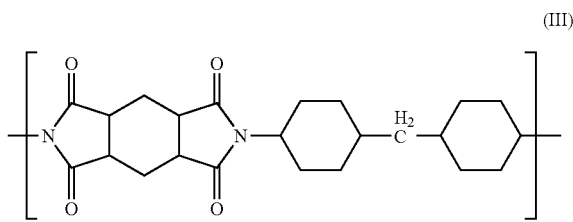

on the basis of the characteristic absorptions attributable to the imide ring at ν(C=O) 1764, 1691 cm$^{-1}$.

The glass transition temperature and dielectric constant of the film are shown in Table 1.

The obtained polyimide solution was applied onto a 18 μm-thick electrolytic copper foil of the same type as used in Example 1, heated on a hot plate at 90° C. for one hour to evaporate the solvent, and, after fixed to a stainless steel jig, heated in a hot air dryer at 220° C. for 2 h to further evaporate the solvent, thereby obtaining a single-sided flexible copper-clad laminate having a 25 μm-thick polyimide layer. A separate 18 μm-thick electrolytic copper foil of the same type as used above was further thermopress-bonded to the polyimide layer of the single-sided flexible copper-clad laminate by a hot press at 280° C. for 30 min to obtain a double-sided flexible copper-clad laminate. The adhesion strength of the double-sided flexible copper-clad laminate is shown in Table 1.

Comparative Example 1

In a 500-mL five-necked flask of the same type as used in Example 1, 10.0 g (0.06 mol) of 4,4'-diaminodiphenyl ether was dissolved in 85.0 g of dimethylacetamide as a solvent. Into the resultant solution, 10.9 g (0.05 mol) of solid pyromellitic dianhydride was added over about one hour at room temperature under a nitrogen flow. After completion of the addition, the mixture was stirred at room temperature for 3 h to obtain a polyamic acid solution. The obtained solution was applied onto a glass plate and heated for one hour on a hot plate at 90° C. to evaporate the solvent. The resultant film was separated from the glass plate to obtain a self-supporting film. The self-supporting film was fixed to a stainless steel jig and then heated in a hot air dryer at 100° C. for 3 h, at 200° C. for 3 h, at 250° C. for 2 h, at 300° C. for one hour and then at 400° C. for one hour to further evaporate the solvent, thereby obtaining a 50 μm-thick brown flexible polyimide film. The glass transition temperature and dielectric constant of the film are shown in Table 1.

The obtained polyamic acid solution was applied onto a 18 μm-thick electrolytic copper foil of the same type as used in Example 1, heated on a hot plate at 90° C. for one hour to evaporate the solvent, and, after fixed to a stainless steel jig, heated in a hot air dryer at 100° C. for 3 h, at 200° C. for 3 h, at 250° C. for 2 h, at 300° C. for one hour and then at 400° C. for one hour to further evaporate the solvent, thereby obtaining a single-sided flexible copper-clad laminate having a 25 μm-thick polyimide layer. A separate 18 μm-thick electrolytic copper foil of the same type as used above was further thermopress-bonded to the polyimide layer of the single-sided flexible copper-clad laminate by a hot press at 350° C. for 30 min to obtain a double-sided flexible copper-clad laminate. The adhesion strength of the double-sided flexible copper-clad laminate is shown in Table 1.

TABLE 1

| Polyimide | Example 1 | Example 2 | Comp. Example 1 |
|---|---|---|---|
| tetracarboxylic acid component | CTDA | CTDA | PMDA |
| diamine-related component | ODA | DCHM | ODA |
| Thickness of polyimide layer (μm) | 25 | 25 | 25 |
| Glass transition temperature (° C.) | 315 | 261 | >400 |
| Dielectric constant at 10 GHz | 3.02 | 2.80 | 3.2 |
| Pressing conditions (min/° C.) | 30/330 | 30/280 | 30/350 |
| Adhesion strength (kgf/cm) | 1.58 | 1.50 | <0.5 |

Copper foil used: "3EC-VLP" available from Mitsui Mining & Smelting Co., Ltd. (thickness: 18 μm)
CTDA: 1,2,4,5-cyclohexanetetracarboxylic dianhydride
PMDA: Pyromellitic dianhydride
ODA: 4,4'-diaminodiphenyl ether
DCHM: 4,4'-diaminodicyclohexylmethane

TABLE 2

| | Example 1 | |
|---|---|---|
| | Dielectric constant | Dielectric loss tangent |
| 1 GHz | 3.20 | 0.017 |
| 5 GHz | 3.10 | 0.017 |
| 10 GHz | 3.02 | 0.017 |
| 20 GHz | 3.00 | 0.015 |

Example 3

The polyimide solution obtained in Example 1 was applied onto a glass plate and heated for one hour on a hot plate at 90° C. to evaporate the solvent. The resultant film was separated from the glass plate to obtain a self-supporting film. The self-supporting film was fixed to a stainless steel jig and then heated in a hot air dryer at 220° C. for 2 h to further evaporate the solvent, thereby obtaining a 100 μm-thick light brown flexible film. The obtained polyimide film was interposed between two 18 μm-thick electrolytic copper foils of the same type as used in Example 1, and then thermopress-bonded by a hot press at 330° C. for 30 min to obtain a double-sided flexible copper-clad laminate. The adhesion strength of the double-sided flexible copper-clad laminate is shown in Table 3.

Example 4

The polyimide solution obtained in Example 2 was applied onto a glass plate and heated for one hour on a hot plate at 90° C. to evaporate the solvent. The resultant film was separated from the glass plate to obtain a self-supporting film. The self-supporting film was fixed to a stainless steel jig and then heated in a hot air dryer at 220° C. for 2 h to further evaporate the solvent, thereby obtaining a 100 μm-thick colorless transparent flexible film. The obtained polyimide film was interposed between two 18 μm-thick electrolytic copper foils of the same type as used in Example 1, and then thermopress-bonded by a hot press at 280° C. for 30 min to obtain a double-sided flexible copper-clad laminate. The adhesion strength of the double-sided flexible copper-clad laminate is shown in Table 3.

Comparative Example 2

The polyamic acid solution obtained in Comparative Example 1 was applied onto a glass plate and heated for one hour on a hot plate at 90° C. to evaporate the solvent. The resultant film was separated from the glass plate to obtain a self-supporting film. The self-supporting film was fixed to a stainless steel jig and then heated in a hot air dryer at 100° C. for 3 h, at 200° C. for 3 h, at 250° C. for 2 h, at 300° C. for one hour and then at 400° C. for one hour to further evaporate the solvent, thereby obtaining a 50 μm-thick brown flexible polyimide film. The obtained polyimide film was interposed between two 18 μm-thick electrolytic copper foils of the same type as used in Example 1, and then thermopress-bonded by a hot press at 350° C. for 30 min to obtain a double-sided flexible copper-clad laminate. The adhesion strength of the double-sided flexible copper-clad laminate is shown in Table 3.

TABLE 3

|  | Example 3 | Example 4 | Comp. Example 2 |
|---|---|---|---|
| Polyimide |  |  |  |
| tetracarboxylic acid component | CTDA | CTDA | PMDA |
| diamine-related component | ODA | DCHM | ODA |
| Thickness of polyimide layer (μm) | 100 | 100 | 50 |
| Glass transition temperature (° C.) | 315 | 261 | >400 |
| Dielectric constant at 10 GHz | 3.02 | 2.80 | 3.2 |
| Pressing conditions (min/° C.) | 30/330 | 30/280 | 30/350 |
| Adhesion strength (kgf/cm ) | 1.58 | 1.50 | <0.5 |

Copper foil used: "3EC-VLP" available from Mitsui Mining & Smelting Co., Ltd. (thickness: 18 μm)
CTDA: 1,2,4,5- cyclohexanetetracarboxylic dianhydride
PMDA: Pyromellitic dianhydride
ODA: 4,4'diaminodiphenyl ether
DCHM: 4,4'-diaminodicyclohexylmethane Example 5

The polyimide solution obtained in Example 1 was applied onto a glass plate and heated for one hour on a hot plate at 90° C. to evaporate the solvent. The resultant film was separated from the glass plate to obtain a self-supporting film. The self-supporting film was fixed to a stainless steel jig and then heated in a hot air dryer at 220° C. for one hour to further evaporate the solvent, thereby obtaining a 100 μm-thick light brown flexible film. Then, the obtained polyimide film was immersed in a 1 mol/L sodium hydroxide aqueous solution at 50° C. for 15 min, washed with water, and then subjected to electroless plating in the following manner. First, the film was immersed in 5% hydrochloric acid containing 30.0 g/L tin (II) chloride at 25° C. for 2 min, and then in 5% hydrochloric acid containing 0.5 g/L palladium chloride at 25° C. for 2 min to make the film catalytically active. After washed with water, the film was immersed in an electroless copper plating bath composed of an aqueous solution containing 15.0 g/L copper sulfate, 45.0 g/L EDTA-2Na, 4.0 g/L NaOH, 3.0 g/L formaldehyde and 0.65 g/L polyoxyethylene dodecyl thioether at 70° C. for 5 min to conduct electroless copper plating. The thickness of the copper layer electrolessly plated on the film was 0.8 μm.

After washed with water, the double-sided copper-clad polyimide film Was electroplated at a current density of 1 A/dm² at 25° C. for 20 min in a copper plating bath composed of an aqueous solution containing 100 g/L copper sulfate and 120 g/L 98% sulfuric acid. The total thickness of the copper films formed on the film by electroless plating and electroplating was 8 μm. By further continuing the electroplating for 60 min to form a copper layer having a total thickness of 30 μm, a double-sided flexible copper-clad laminate for the adhesion strength test of copper layer was obtained. The adhesion strength of the double-sided flexible copper-clad laminate is shown in Table 4.

Example 6

The polyimide solution obtained in Example 2 was applied onto a glass plate and heated for one hour on a hot plate at 90° C. to evaporate the solvent. The resultant film was separated from the glass plate to obtain a self-supporting film. The self-supporting film was fixed to a stainless steel jig and then heated in a hot air dryer at 220° C. for one hour to further evaporate the solvent, thereby obtaining a 100 μm-thick colorless transparent flexible film. The obtained polyimide film was immersed in an aqueous solution containing 5 mol/L of hydrazine and 1 mol/L of sodium hydroxide at 25° C. for one minute and washed with water. After drying, the film was sputtered with copper in a high-frequency sputtering apparatus for 20 min in the presence of argon gas under the conditions of 0.1 Pa, a substrate temperature of 100° C., a power density of 60 kW/m² and an applied voltage of 2 kV, thereby depositing a 0.6 μm-thick copper thin film on the polyimide film.

The copper thin film-deposited polyimide film was electroplated at a current density of 1 A/dm² at 25° C. for 20 min in a copper plating bath composed of an aqueous solution containing 100 g/L copper sulfate and 120 g/L 98% sulfuric acid. The total thickness of the copper films formed on the film by sputtering and electroplating was 8 μm. By further continuing the electroplating for 60 min to form a copper layer having a total thickness of 30 μm, a double-sided flexible copper-clad laminate for the adhesion strength test of copper layer was obtained. The adhesion strength of the double-sided flexible copper-clad laminate is shown in Table 4.

Comparative Example 3

The polyamic acid solution obtained in Comparative Example 1 was applied onto a glass plate and heated for one hour on a hot plate at 50° C. to evaporate the solvent. The resultant film was separated from the glass plate to obtain a self-supporting film. The self-supporting film was fixed to a stainless steel jig and then heated in a hot air dryer at 100° C. for 3 h, at 200° C. for 3 h, at 250° C. for 2 h, at 300° C. for one hour and then at 400° C. for one hour to further evaporate the solvent, thereby obtaining a 50 μm-thick brown flexible film. Then, the obtained polyimide film was immersed in a 1 mol/L sodium hydroxide aqueous solution at 50° C. for 15 min, washed with water, and then subjected to electroless plating in the following manner. First, the film was immersed in 5% hydrochloric acid containing 30.0 g/L tin (II) chloride at 25° C. for 2 min, and then in 5% hydrochloric acid containing 0.5 g/L palladium chloride at 25° C. for 2 min to make the film catalytically active. After washed with water, the film was immersed in an electroless copper plating bath composed of an aqueous solution containing 15.0 g/L copper sulfate, 45.0 g/L EDTA-2Na, 4.0 g/L NaOH, 3.0 g/L formaldehyde and 0.65 g/L polyoxyethylene dodecyl thioether at 70° C. for 5 min to conduct electroless copper plating. The thickness of the copper layer electrolessly plated on the film was 0.8 μm.

After washed with water, the copper-clad polyimide film was electroplated at a current density of 1 A/dm$^2$ at 25° C. for 20 min in a copper plating bath composed of an aqueous solution containing 100 g/L copper sulfate and 120 g/L 98% sulfuric acid. The total thickness of the copper films formed on the film by electroless plating and electroplating was 8 μm. By further continuing the electroplating for 60 min to form a copper layer having a total thickness of 30 μm, a double-sided flexible copper-clad laminate for the adhesion strength test of copper layer was obtained. The adhesion strength of the double-sided flexible copper-clad laminate is shown in Table 4.

TABLE 4

|  | Example 5 | Example 6 | Comp. Example 3 |
|---|---|---|---|
| Polyimide |  |  |  |
| tetracarboxylic acid component | CTDA | CTDA | PMDA |
| diamine-related component | ODA | DCHM | ODA |
| Thickness of polyimide layer (μm) | 100 | 100 | 50 |
| Glass transition temperature (° C.) | 315 | 261 | >400 |
| Dielectric constant at 10 GHz | 3.02 | 2.80 | 3.2 |
| Adhesion strength (kgf/cm) | 1.23 | 1.05 | 0.83 |

CTDA: 1,2,4,5-cyclohexanetetracarboxylic dianhydride
PMDA: Pyromellitic dianhydride
ODA: 4,4'-diaminodiphenyl ether
DCHM: 4,4'-diaminodicyclohexylmethane Example 7

Two single-sided flexible copper-clad laminates obtained in Example 1 were stacked with the polyimide layers being opposed to each other, and thermopress-bonded by a hot press at 330° C. for 30 min to obtain a double-sided flexible copper-clad laminate. The obtained double-sided flexible copper-clad laminate exhibited a good adhesion condition free from non-adhered portions such as bubbles and did not cause separation even when subjected to bending and flexing action.

Example 8

Two single-sided flexible copper-clad laminates obtained in Example 1 were stacked on each surface of a 25 μm-thick polyimide film "Kapton 100H" commercially available from Toray DuPont Co., Ltd. through the polyimide layers, and thermopress-bonded by a hot press at 330° C. for 30 min to obtain a double-sided flexible copper-clad laminate. The obtained double-sided flexible copper-clad laminate exhibited a good adhesion condition free from non-adhered portions such as bubbles and did not cause separation even when subjected to bending and flexing action.

Example 9

Two single-sided flexible copper-clad laminates obtained in Example 1 were stacked on each circuit surface of an epoxy resin double-sided rigid printed wiring board having a glass cloth substrate ("NEMA:FR-4" available from Fujitsu Interconnect Technologies Limited), and thermopress-bonded by a hot press at 330° C. for 30 min to obtain a flexible, rigid copper-clad laminate. The obtained flexible, rigid copper-clad laminate exhibited a good adhesion condition free from non-adhered portions such as bubbles.

Example 10

An epoxy/acryl-based photoresist was applied onto the copper foil of the single-sided flexible copper-clad laminate obtained in Example 1, exposed to patterning light, and then developed to form a patterned resist. Using the patterned resist as a mask, the copper foil was etched with a mixed solution of hydrochloric acid and ion (III) chloride to form circuit patterns and then the resist was removed to obtain a flexible printed wiring board. The single-sided flexible copper-clad laminate obtained in Example 1 was stacked on the circuit surface of the flexible printed wiring board through the polyimide layer and thermopress-bonded by a hot press at 330° C. for 30 min to obtain a multilayer copper-clad laminate. The obtained multilayer copper-clad laminate exhibited a good adhesion condition free from non-adhered portions such as bubbles and did not cause separation even when subjected to bending and flexing action.

Example 11

An epoxy/acryl-based photoresist was applied onto the copper foil of the single-sided flexible copper-clad laminate obtained in Example 1, exposed to patterning light, and then developed to form a patterned resist. Using the patterned resist as a mask, the copper foil was etched with a mixed solution of hydrochloric acid and ion (III) chloride to form circuit patterns and then the resist was removed. By repeating the above procedure, three flexible printed wiring boards were produced. The second flexible printed wiring board was stacked on the circuit surface of the first flexible printed wiring board through the polyimide surface. Then, the third flexible printed wiring board was stacked on the circuit surface of the second flexible printed wiring board through the polyimide surface. By thermopress-bonding by a hot press at 330° C. for 30 min, a multilayer copper-clad laminate was produced. The obtained multilayer copper-clad laminate exhibited a good adhesion condition free from non-adhered portions such as bubbles and did not cause separation even when subjected to bending and flexing action.

Example 12

An epoxy/acryl-based photoresist was applied onto the copper foil of the single-sided flexible copper-clad laminate obtained in Example 1, exposed to patterning light, and then developed to form a patterned resist. Using the patterned resist as a mask, the copper foil was etched with a mixed solution of hydrochloric acid and ion (III) chloride to form circuit patterns and then the resist was removed to obtain a flexible printed wiring board. The polyimide solution obtained in Example 1 was applied as a cover coat agent onto the circuit surface of the obtained flexible printed wiring board using a doctor blade in a thickness of 90 μm, heated on a hot plate at 90° C. for one hour to evaporate the solvent, and then, after fixed to a stainless steel jig, heated in a hot air dryer at 220° C. for 2 h to further evaporate the solvent to obtain a copper-clad laminate. The thickness of the cover coat layer was 25 μm. The obtained copper-clad laminate exhibited a sufficient flexibility and a good adhesion between the circuit surface of the printed wiring board and the cover coat layer.

Example 13

An epoxy/acryl-based photorersist was applied onto the copper foil of the single-sided flexible copper-clad laminate obtained in Example 1, exposed to patterning light, and then developed to form a patterned resist. Using the patterned resist as a mask, the copper foil was etched with a mixed solution of hydrochloric acid and ion (III) chloride to form circuit patterns and then the resist was removed to obtain a flexible printed wiring board. Separately, the polyimide solution obtained in Example 1 was applied onto a glass plate and heated for one hour on a hot plate at 90° C. to evaporate the solvent. The resultant film was separated from the glass plate to obtain a self-supporting film. The self-supporting film was fixed to a stainless steel jig and then heated in a hot air dryer at 220° C. for 2 h to further evaporate the solvent, thereby obtaining a 30 μm-thick light brown flexible film. The obtained polyimide film was stacked as a cover lay film on the circuit surface of the flexible printed wiring board and then thermopress-bonded by a hot press at 330° C. for 30 min to obtain a copper-clad laminate. The obtained copper-clad laminate exhibited a sufficient flexibility and a good adhesion between the circuit surface of the printed wiring board and the cover lay film.

Example 14

An acrylic resist was applied onto both surfaces of the copper-clad laminate with cover lay obtained in Example 13 by a screen-printing method to form patterns of viaholes each having a diameter of 100 μm. The laminate thus treated was immersed in a N-methyl-2-pyrrolidone bath maintained at 80° C. for 10 min, taken out of the bath and washed with water. Then, the laminate was immersed in an aqueous stripping solution bath at 40° C. for 10 min, taken out of the bath and washed with water. Viaholes were suitably formed on the copper-clad laminate by the wet etching.

Since the insulating layer in the flexible metal-clad laminate of the present invention is made of an aliphatic polyimide having specific repeating units, the dielectric constant is as low as 3.2 or less at 10 GHz and the adhesion property is excellent. The flexible metal-clad laminate is suitable for use in high frequency printed wiring boards, etc.

What is claimed is:

1. A flexible metal-clad laminate comprising:
   at least one polyimide layer, including a first polyimide layer, made of a polyimide having repeating units represented by the following formula I:

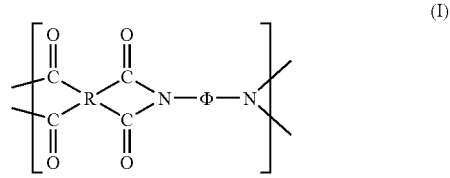

wherein R is a cyclohexanetetrayl group; Φ is a group selected from the group consisting of:

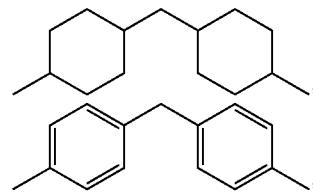

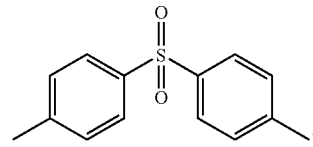

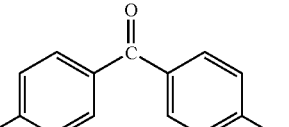

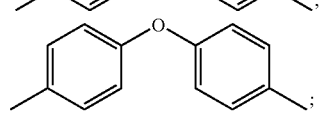, and

; and at least one metal layer, including a first metal layer,
wherein the polyimide layer is formed from a solution of the polyimide in an organic solvent, and an adhesion strength between the first polyimide layer and the first metal layer is at least 1 kgf/cm.

2. The flexible metal-clad laminate according to claim 1, wherein the first metal layer is a metal foil and the first polyimide layer is formed by applying a solution of the polyimide in an organic solvent onto the metal foil and then drying the solution applied.

3. The flexible metal-clad laminate according to claim 1, wherein the first metal layer is a metal foil and the first polyimide layer is a film made of the polyimide, the metal foil and the film being thermopress-bonded to each other.

4. The flexible metal-clad laminate according to claim 1, wherein the first polyimide layer is a film made of the polyimide and the first metal layer comprises at least one metal film formed on a surface of the polyimide film by at least one thin film-forming method selected from the group consisting of sputtering, vapor deposition and electroless plating.

5. The flexible metal-clad laminate according to claim 1, further comprising a rigid printed wiring board thermopress-bonded to a surface metal layer or a surface polyimide layer.

6. The flexible metal-clad laminate according to claim 1, wherein the polyimide has a glass transition temperature of 350° C. or lower.

7. The flexible metal-clad laminate according to claim 1, wherein the polyimide has a dielectric constant of 3.2 or lower at 10 GHz.

8. The flexible metal-clad laminate according to claim 1, wherein the repeating unit represented by the formula I is 10 to 100 mol % of the repeating units of said polyimide.

9. The flexible metal-clad laminate according to claim 1, wherein the number of the repeating units represented by the formula I, in said polyimide, is 10 to 2000.

10. The flexible metal-clad laminate according to claim 1, wherein said organic solvent is selected from the group consisting of N-methyl-2-pyrrolidone, N,N-dimethylacetoamide, N,N-dimethylformamide, dimethylsulfoxide, hexamethylphosphoramide, tetramethylenesulfone, p-chlorophenol, m-cresol and 2-chloro-4-hydroxytoluene.

11. The flexible metal-clad laminate according to claim 1, wherein each of the at least one polyimide layer has a thickness of 10 to 100 μm.

12. The flexible metal-clad laminate according to claim 1, wherein the at least one metal layer has a thickness of 5 to 100 μm.

13. The flexible metal-clad laminate according to claim 1, wherein the at least one metal layer is made of a material selected from the group consisting of copper, aluminum, stainless steel, gold, silver and nickel.

14. The flexible metal-clad laminate according to claim 1, wherein said polyimide is soluble in an aprotic organic polar solvent.

15. The flexible metal-clad laminate according to claim 1, wherein said at least one polyimide layer consists essentially of said polyimide having repeating units represented by said formula I.

16. The flexible metal-clad laminate according to claim 1, wherein said first metal layer is in direct contact with said first polyimide layer.

17. The flexible metal-clad laminate according to claim 1, wherein said at least one polyimide layer consists of said polyimide having repeating units represented by said formula I.

18. The flexible metal-clad laminate according to claim 1, wherein Φ is

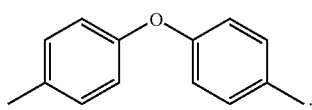

19. The flexible metal-clad laminate according to claim 1, wherein R is a cyclohexanetetrayl group derived from cyclohexane tetracarboxylic dianhydride.

20. The flexible metal-clad laminate according to claim 19, wherein Φ is

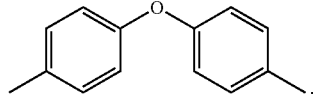

21. The flexible metal-clad laminate according to claim 1, further comprising a second metal layer formed on a surface of the first polyimide layer.

22. The flexible metal-clad laminate according to claim 21, wherein the second metal layer comprises at least one metal film formed by at least one thin film-forming method selected from the group consisting of sputtering, vapor deposition and electroless plating.

23. The flexible metal-clad laminate according to claim 21, wherein the second metal layer is a metal foil that is thermopress-bonded to the first polyimide layer.

24. The flexible metal-clad laminate according to claim 1, further comprising another said flexible metal-clad laminate on the first polyimide layer, wherein the first polyimide layer is thermopress-bonded to a first polyimide layer of said another said flexible metal-clad laminate.

25. The flexible metal-clad laminate according to claim 24, further comprising a rigid printed wiring board thermopress-bonded to a surface metal layer.

26. The flexible metal-clad laminate according to claim 24, wherein the polyimide has a glass transition temperature of 350° C. or lower.

27. The flexible metal-clad laminate according to claim 24, wherein the polyimide has a dielectric constant of 3.2 or lower at 10 GHz.

28. The flexible metal-clad laminate according to claim 24, wherein circuit patterns are formed in a surface metal layer.

29. The flexible metal-clad laminate according to claim 28, further comprising another said flexible metal-clad laminate which is thermopress-bonded to a surface on which the circuit patterns are formed.

30. A metal-clad laminate comprising one or more flexible metal-clad laminates as claimed in claim 28 which are thermopress-bonded to each other.

31. The flexible metal-clad laminate according to claim 28, further comprising a cover layer made of the polyimide which is formed on the surface on which the circuit patterns are formed.

32. The flexible metal-clad laminate according to claim 31, wherein the cover layer made of the polyimide is a film formed by applying a solution of the polyimide in an organic solvent onto the surface and then evaporating the solvent.

33. The flexible metal-clad laminate according to claim 31, wherein the cover layer made of the polyimide is formed by thermopress-bonding a film made of the polyimide.

34. The flexible metal-clad laminate according to claim 31, wherein the cover layer made of the polyimide has a property that it is patterned by a wet-etching method using an aprotic organic polar solvent as an etchant.

35. The flexible metal-clad laminate according to claim 1, wherein circuit patterns are formed in a surface metal layer.

36. The flexible metal-clad laminate according to claim 35, further comprising another said flexible metal-clad laminate which is thermopress-bonded to a surface on which the circuit patterns are formed.

37. A metal-clad laminate comprising one or more flexible metal-clad laminates as claimed in claim 35 which are thermopress-bonded to each other.

38. The flexible metal-clad laminate according to claim 35, further comprising a cover layer made of the polyimide which is formed on the surface on which the circuit patterns are formed.

39. The flexible metal-clad laminate according to claim 38, wherein the cover layer made of the polyimide is a film formed by applying a solution of the polyimide in an organic solvent onto the surface and then evaporating the solvent.

40. The flexible metal-clad laminate according to claim 38, wherein the cover layer made of the polyimide is formed by thermopress-bonding a film made of the polyimide.

41. The flexible metal-clad laminate according to claim 38, wherein the cover layer made of the polyimide has a property that it is patterned by a wet-etching method using an aprotic organic polar solvent as an etchant.

* * * * *